(12) United States Patent
Tanaka (10) Patent No.: US 6,504,299 B1
(45) Date of Patent: Jan. 7, 2003

(54) MINUSCULE LIGHT-EMITTING DEVICE AND ORGANIC EL DEVICE USING THE SAME

(75) Inventor: Haruo Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/435,837

(22) Filed: Nov. 8, 1999

(30) Foreign Application Priority Data

Nov. 6, 1998 (JP) ............................................ 10-316056

(51) Int. Cl.$^7$ ................................................. H05B 33/12
(52) U.S. Cl. ............................................................ 313/504
(58) Field of Search ................................. 313/504, 505, 313/506, 512; 315/169.3; 345/76; 428/690, 917

(56) References Cited

U.S. PATENT DOCUMENTS

| | | | | |
|---|---|---|---|---|
| 5,276,380 A | * | 1/1994 | Tang ........................ | 313/505 X |
| 5,294,870 A | * | 3/1994 | Tang et al. .............. | 313/505 X |
| 5,773,931 A | * | 6/1998 | Shi et al. ................. | 313/504 X |
| 6,351,066 | * | 2/2002 | Gyoutoku et al. ...... | 313/505 X |

* cited by examiner

Primary Examiner—Ashok Patel
(74) Attorney, Agent, or Firm—Morgan, Lewis & Bockius LLP

(57) ABSTRACT

On an uppermost plane of a glass substrate 3, a lower electrode 7 and a upper electrode 5 with an organic EL layer 6 intervening therebetween are laminated in an orthogonal manner. The lower electrode 7, upper electrode 5 and an organic EL layer 6 have a width W=10 nm, respectively. In this configuration, a light source with a minute light-emitting region having an area of 10 nm×10 nm can be obtained. The glass substrate 3 is formed as a multi-stage structure so that the light-emitting region can be placed at a position close to an object. Thus, a simple light source which can be used near field optics is provided.

20 Claims, 12 Drawing Sheets

MINUSCULE LIGHT-EMITTING DEVICE AND ORGANIC EL DEVICE USING THE SAME

BACKGROUND OF THE INVENTION

1. Field of the Invention

The present invention relates to an organic EL device, and more particularly to a light source used for near field optics.

2. Description of the Related Art

Nowadays, for the purpose of write and read of a high density optical disk exceeding analysis limitation of light, attention is being given of an optical technique using the near field optics. The near field optics is to irradiate an object for read with light in a state where a light source is made sufficiently close to the object from an opening having a diameter much smaller than the wavelength of the irradiated light so that changes in optical property smaller than the wavelength of irradiated light can be read.

Figure 15:
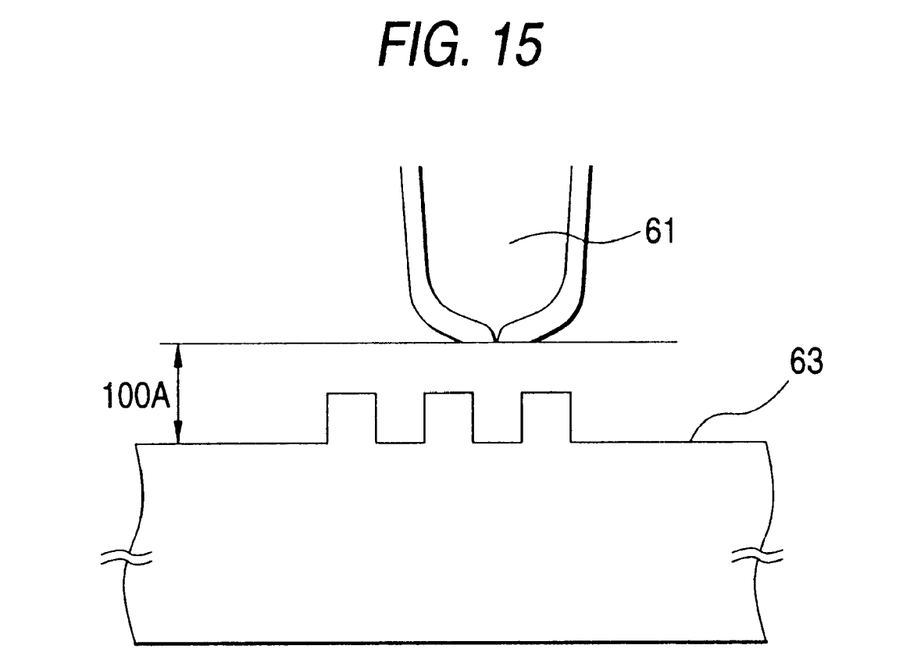
FIG. 15 is a view showing the shape of a conventional fiber probe.

The light source used in a near field optical recording system using the near field optics must satisfy the conditions that its opening can be micro-machined, and it can approach the object. In order to satisfy these conditions, as shown in FIG. 15, a probe 61 has been proposed which: is formed by etching an optical fiber by an etching solution having a specific composition. By placing the probe 61 at a close position (100–200 A) from an object 63 so that a region irradiated with light is limited to a an minute area, write and read of the optical property smaller than the wavelength of light can be made.

However, the above etching technique used to form the probe requires a very sophisticated technique. In addition, the probe, which has a protrusion, is low in mechanical strength.

Therefore, the light source used in the near field optical recording system could not be realized easily and surely. The present invention intends to solve such a problem.

SUMMARY OF THE INVENTION

An object of the present invention is to provide a simple light source which can be used for near field optics.

A first aspect of the device is a minuscule light-emitting device having a light source used for near field optics, said light source being an organic EL device comprising: a lower electrode;
 an organic EL layer placed on or above the lower lectrode; and an upper electrode placed on or above said organic EL layer, whereby an object for read is irradiated with light in a state where the light source is made sufficiently close to the object, from an opening having a diameter with a maximum length much smaller than the.wavelength of the irradiated light so that changes in optical property of the object are read.

Therefore, by micromachining the superposed area so that the light emitting region has a minimum width that is smaller than the light emitting wavelength of the organic EL device, the organic EL device can be easily used for a light source in the near field optics.

A second aspect of the device is a minuscule light-emitting device as set forth in the first aspect, wherein said lower electrode and said upper electrode are orthogonal to each other.

Preferably, the lower electrode and the upper electrode are orthogonal to each other. Therefore, the above superposed area can be easily formed. A third aspect of the device is a minuscule light-emitting device as set forth in the first aspect, wherein in a region where said lower electrode and said upper electrode cross, at least one of said lower electrode and said upper electrode has a portion having a smaller width than the remaining portion.

In accordance with such a configuration, since the light emitting region is defined by the region having a small width, a fine light emitting region can be easily defined.

A fourth aspect of the device is a minuscule light-emitting device as set forth in the first aspect, wherein in said organic EL device, said lower electrode and said upper electrode are formed in stripe patterns which are orthogonal to each other, and in a region where said lower electrode and said upper electrode cross, an interface between said organic EL layer and at least one of said lower electrode and said upper electrode is selectively oxidized except a portion thereof.

In accordance with such a configuration, in a region where the upper electrode and lower electrode cross, the oxidized area of the interface with the organic EL layer is an insulating area to which no electric field is applied and serves as an non-light-emitting region. Therefore, a fine light emitting area over the limit of lithography can be easily formed. By performing the oxidation through pattern exposure using a near field, a finer light emitting area can be formed.

A fifth aspect of the device is a minuscule light-emitting device as set for the in the fourth aspect, wherein said region has a minimum width which is shorter than a wavelength of light emitted from said organic EL layer.

A sixth aspect of the device is a minuscule light-emitting device as set for the in the first aspect, wherein in said organic EL device, said lower electrode and upper electrode are formed in stripe patterns which are orthogonal to each other, and in a region where said lower electrode and said upper electrode cross, said upper electrode is formed in a stripe pattern having an inverted trapezoidal sectional shape.

In accordance with such a configuration, since the upper electrode has an inverted trapezoidal sectional shape, through detouring of etching, a fine light emitting area over the limit of lithography can be easily formed.

A seventh aspect is a minuscule light-emitting device as set for the the seventh aspect, wherein in said organic EL device, said lower electrode and said upper electrode are formed in stripe patterns which are orthogonal to each other, and in a region where said lower electrode and said upper electrode cross, said lower electrode is formed in a stripe pattern having an inverted trapezoidal sectional shape in which a region exclusive of an apex is covered with an insulating film.

In accordance with such a configuration, since the lower electrode is formed in a pattern having an inverted trapezoidal sectional shape in which a region exclusive of an apex is covered with an insulating film, through detouring of etching, a fine light emitting area over the limit of lithography can be easily formed.

An eighth aspect is a minuscule light-emitting device as set forth the first aspect, wherein said organic EL device comprises: a lower electrode; an organic EL layer placed on or above said lower electrode; and an upper electrode placed on or above said organic EL layer, wherein a wavelength of light emitted from said organic EL layer is longer than that of a short side of a light emitting region.

In accordance with such a configuration, the light emitting area can be formed in e.g. a slit shape having a very smaller width so as to provide a stable minuscule light-emitting device.

A ninth aspect of the device is a minuscule light-emitting device as set for the in the first aspect, wherein said organic EL device comprises: an lower electrode; an organic EL layer placed on or above said lower electrode; and an upper electrode placed on or above said organic EL layer, wherein said upper electrode is made from a light shielding conductive film, and in a region where said lower electrode and upper electrode cross, said conductive film has a through-hole having a diameter which is smaller than a wavelength of light emitted form said organic EL layer.

In accordance with such a configuration, only the portion of the through-hole defines a light take-out area, i.e. the light emitting area of the organic EL device so that the fine light emitting area defined by only the through-hole can be obtained. In this configuration, light with enhanced intensity can be taken out.

A tenth aspect is a minuscule light-emitting device as set forth in claim 1, wherein said organic EL device comprises: a lower electrode formed on a substrate; an organic EL layer placed on or above said lower electrode; and an upper electrode placed on or above said organic EL layer, wherein said upper electrode is made from an insulating light shielding conductive film which covers the entire surface of said substrate including said upper electrode, and in a region where said lower electrode and upper electrode cross, said light shielding film has a though-hole having a diameter which is smaller than a wavelength of light emitted form said organic EL layer.

In accordance with such a configuration, only the portion of the through-hole formed in the insulating, light shielding film defines a light take-out area, i.e. the light emitting area of the organic EL device so that the fine light emitting area defined by only the through-hole can be obtained. In this configuration, light with enhanced intensity can be taken out.

An eleventh aspect of the device is a minuscule light-emitting device as set forth the tenth aspect, wherein said through-hole has a diameter which is larger on the side of said upper electrode than on the side of the surface.

In this configuration, a beam can be formed which is converged with a smaller diameter than the opening diameter of the through-hole, thereby providing finer light emission.

A twelfth aspect of the device is a minuscule light-emitting device as set forth the tenth aspect, wherein said through-hole is a slit whose width is larger on the side of the upper electrode than the side of the surface.

In this configuration, a beam can be formed which is converged with a smaller diameter than the opening diameter of the slit, thereby providing finer light emission.

A thirteenth aspect of the device is a minuscule light-emitting device as set forth the tenth aspect, wherein said through-hole is formed by beam exposure using near field optics.

In accordance with such a configuration, a finer through-hole can be formed so as to fine light emission.

A fourteenth aspect of the device is a minuscule light-emitting device having a light source used for near field optics, said light source being an organic EL device comprising: a first electrode and a second electrode having acute edges formed on a substrate so as to be opposite to each other through a fine gap; and an organic EL layer filled in said gap, whereby an object for read is irradiated with light in a state where the light source is made sufficiently close to the object, the light having a diameter with a maximum length much smaller than the wavelength of the irradiated light so that changes in optical property of the object are read.

In such a configuration, a very fine gap can be formed. The organic EL layer in the very fine gap is caused to emit light so that the reliable fine light emitting beam can be obtained.

A fifteenth aspect of the device is a minuscule light-emitting device as set forth the first aspect, wherein said organic EL device comprises: an lower electrode formed on a substrate; a light emitting layer formed on said lower electrode; and an upper electrode formed on said light-emitting layer and made of an oxygen permeable material, and wherein a partial region of the light emitting layer constitutes an oxide layer which is selectively formed by optical selective oxidation using light and oxygen which reaches through the upper electrode, and the region of the light emitting layer where the oxide layer is located serves as a non-light emitting region so that the minimum width of the light emitting region in the organic EL layer is shorter than the wavelength of the light emitted from the organic EL layer.

A sixteenth aspect of the device is an organic EL device comprising: a lower electrode; an organic EL layer placed on or above said lower electrode; and an upper electrode placed on or above said organic EL layer, wherein a light emitting region has a maximum length that is shorter than a wavelength of light emitted form said organic EL layer.

A seventeenth aspect of the device is an organic EL device as set forth the sixteenth aspect, wherein said lower electrode and said upper electrode are orthogonal to each other.

An eighteenth aspect of the device is an organic EL device, comprising: a lower electrode; an organic EL layer placed on or above the lower electrode; and an upper electrode placed on or above said organic EL layer, wherein in a region where said lower electrode and said upper electrode cross, at least one of said a lower electrode and said upper electrode has a portion having a smaller width than the remaining portion.

A ninteenth aspect of the device is an organic EL device as set forth the sixteenth aspect, wherein said lower electrode and said upper electrode are formed in stripe patterns which are orthogonal to each other, and in a region where said lower electrode and said upper electrode cross, an interface between said organic EL layer and at least one of said lower electrode and said upper electrode is selectively oxidized except a portion thereof.

A twentieth aspect of the device is an organic EL device as set forth the sixteenth aspect, wherein said region has a minimum width which is shorter than a wavelength of light emitted from said organic EL layer.

A twenty first aspect of the device is an organic EL device as set forth the sixteenth aspect, wherein said lower electrode and upper electrode are formed in stripe patterns which are orthogonal to each other, and in a region where said lower electrode and said upper electrode cross, said upper electrode is formed in a stripe pattern having an inverted trapezoidal sectional shape.

A twenty second aspect of the device is an organic EL device as set forth the sixteenth aspect, wherein said lower electrode and said upper electrode are formed in stripe patterns which are orthogonal to each other, and in a region where said lower electrode and said upper electrode cross, said lower electrode is formed in a stripe pattern having an inverted trapezoidal sectional shape in which a region exclusive of an apex is covered with an insulating film.

A twenty third aspect of the device is an organic EL device as set forth the sixteenth aspect, wherein said organic EL device comprises: a lower electrode; an organic EL layer placed on or above said lower electrode; and an upper electrode placed on or above said organic EL layer, wherein a wavelength of light emitted from said organic EL layer is longer than that of a short side of a light emitting region.

A twenty forth aspect of the device is an organic EL device as set forth the sixteenth aspect, wherein said organic EL device comprises: a lower electrode; an organic EL layer placed on or above said lower electrode; and an upper electrode placed on or above said organic EL layer, wherein said upper electrode is made from a light shielding conductive film, and in a region where said lower electrode and upper electrode cross, said conductive film has a through-hole having a diameter which is smaller than a wavelength of light emitted form said organic EL layer.

A twenty fifth aspect of the device is an organic EL device which comprises: a lower electrode formed on a substrate; an organic EL layer placed on or above said lower electrode; and an upper electrode placed on or above said organic EL layer, wherein said upper electrode is made from an insulating light shielding conductive film which covers the entire surface of said substrate including said upper electrode, and in a region where said lower electrode and upper electrode cross, said light shielding film has a though-hole having a diameter which is smaller than a wavelength of light emitted form said organic EL layer.

A twenty sixth aspect of the device is an organic EL device as set forth the sixteenth aspect, wherein said through-hole has a diameter which is larger on the side of said upper electrode than on the side of the surface.

A twenty seventh aspect of the device is an organic EL device as set forth the sixteenth aspect, wherein said through-hole is a slit whose width is larger on the side of the upper electrode than the side of the surface.

A twenty eighth aspect of the device is an organic EL device as set forth the sixteenth aspect, wherein said through-hole is formed by beam exposure using near field optics.

A twenty ninth aspect of the device is an organic EL device comprising: a first electrode and a second electrode having acute edges formed on a substrate so as to be opposite to each other through a fine gap; and an organic EL layer filled in said gap.

A thirteenth aspect of the device is an organic EL device, comprising: a lower electrode formed on a substrate; a light emitting layer formed on said lower electrode; and an upper electrode formed on said light-emitting layer and made of an oxygen permeable material, and wherein a partial region of the light emitting layer constitutes an oxide layer which is selectively formed by optical selective oxidation using light and oxygen which reaches through the upper electrode, and the region of the light emitting layer where the oxide layer is located serves as a non-light emitting region so that the minimum width of the light emitting region in the organic EL layer is shorter than the wavelength of the light emitted from the organic EL layer.

Incidentally, the expression "placed on or above" means that the upper layer is formed directly or through any other layer on the lower layer and any other layer may be formed therebetween.

The above and other objects and features of the present invention will be more apparent from the following description taken in conjunction with the accompanying drawings.

BRIEF DESCRIPTION OF THE DRAWINGS

FIGS. 7A, 6B, 7C, 7D, 8A, 8B, 9A, 9B, 10A, 10B, 11A, 11B, 12, 13A, 13B, 14A, 14B, 14C, 14D and 14E are views of organic EL devices according to the second, third, fourth, fifth, sixth, seventh, eighth and ninth embodiment of the present invention;

DESCRIPTION OF THE PREFERRED EMBODIMENTS

Now referring to the drawings, an explanation will be given of embodiments of the organic EL device according to the present invention.

Embodiment 1

Figure 1:
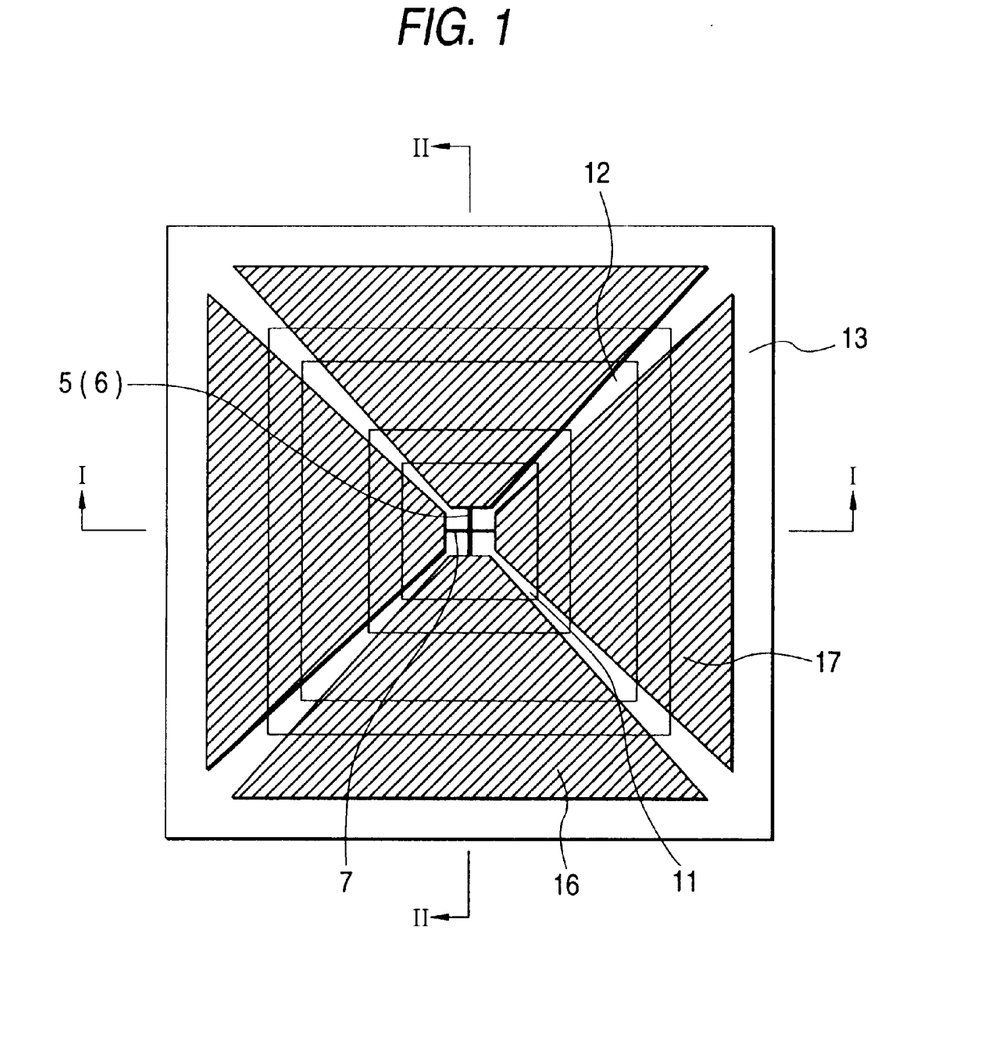
FIG. 1 is a plan view of an organic EL device according to the first embodiment of the present invention.
Figure 2:
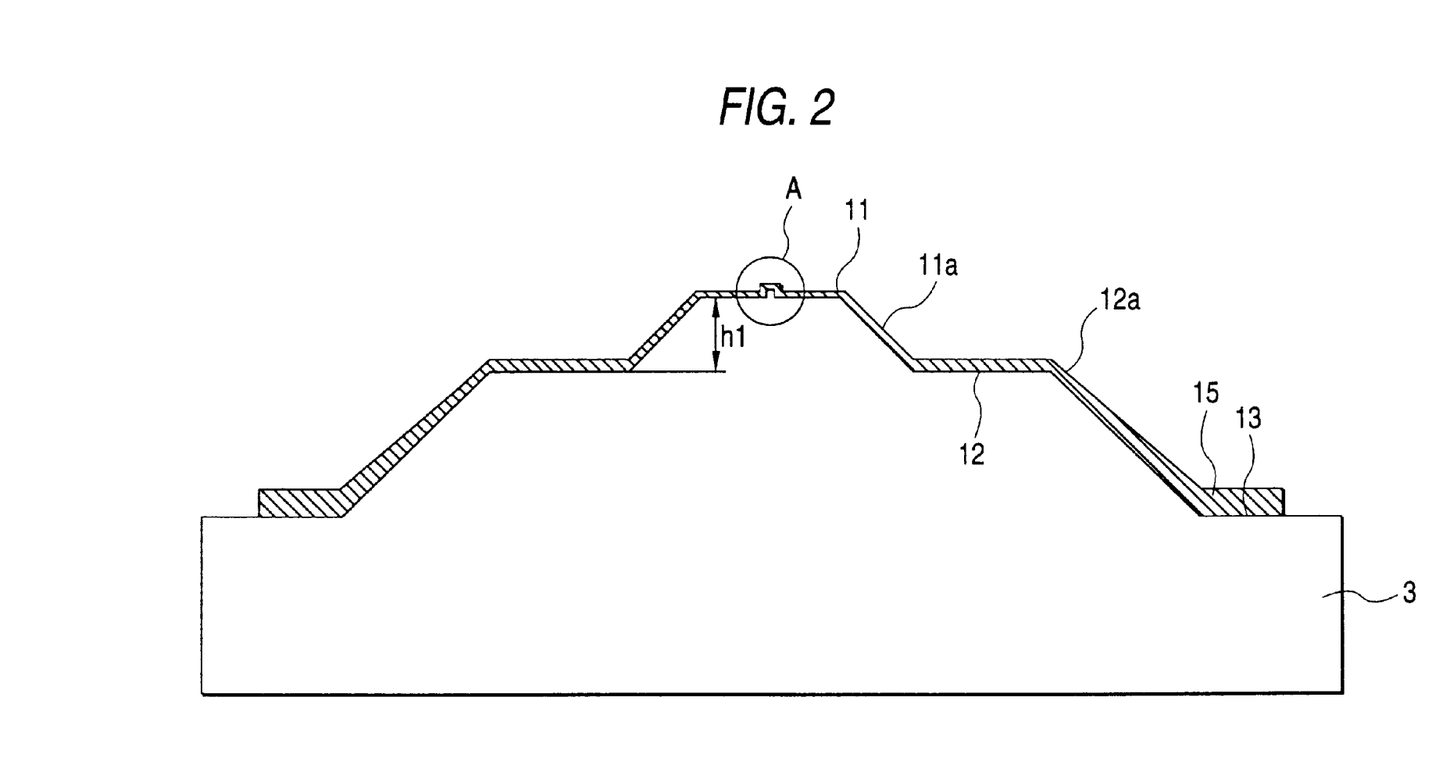
FIG. 2 is a sectional view of the organic EL device taken in line II—II in FIG. 1.

FIG. 1 is a plan view of an organic EL device according to the first embodiment of the present invention. FIG. 2 is a sectional view of the organic EL device taken in line II—II in FIG. 1.

In an organic EL device 1, a glass substrate 3, as seen from FIG. 2, has a plurality of planes 11, 12 and 14. Between the respective planes, slopes 1a and 12a are formed (hereinafter, such a structure will be referred to as "section multi-stage structure") As seen from FIG. 1, a lower electrode 7 is formed so that it extends over the lower most plane 13, slope 12a, plane 12, slope 11a on the one side of the substrate, topmost plane 11, and plane 12, slope 12a and plane 13 on the other side of the substrate.

An upper electrode 5 is formed to extend over a plurality of planes and slopes. The upper electrode 5 is orthogonal to the lower electrode 7.

Figure 3A:
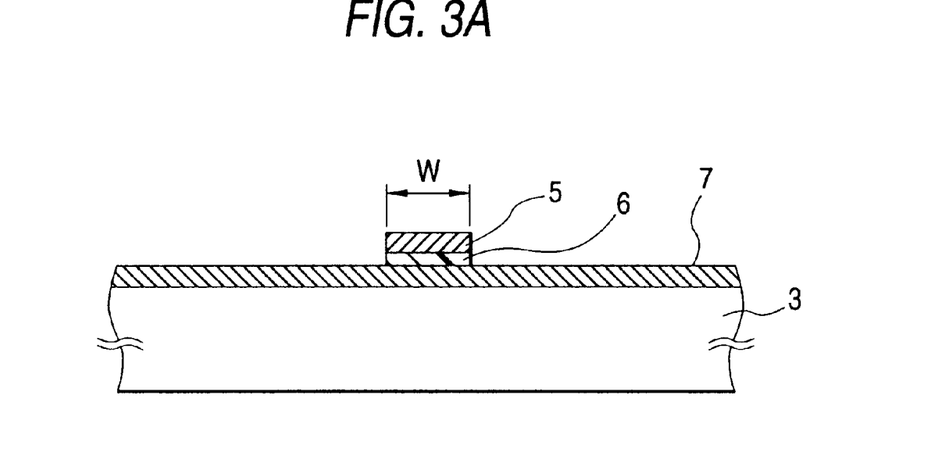
FIGS. 3A and 3B are enlarged views of the vicinity of the top area in FIG. 2.
Figure 3B:
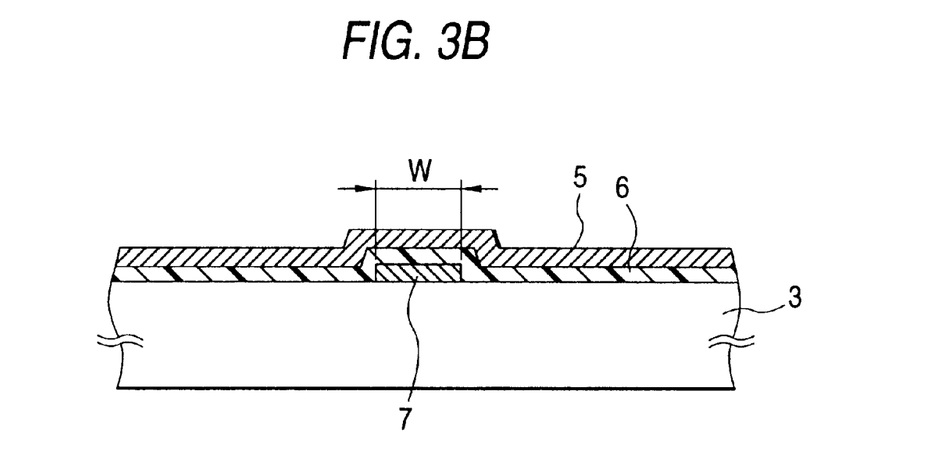

Referring to FIGS. 3A and 3B, an explanation will be given of the laminate structure of the topmost plane 11. FIG. 3A is an enlarged view taken in line I—I in FIG. 1. FIG. 3B is an enlarge view taken in line II—II in FIG. 2. As seen from FIGS. 3A and 3B, the upper electrode 5 and the organic EL layer 6, and the lower electrode 7 are laminated is such a manner that they are orthogonal to each other. The upper electrode 5, organic EL layer 6 and lower electrode are formed to have a minute width W. In this embodiment, each width is set at W=10 nm. It should be noted that the organic EL layer 6 is formed on only the plane 11.

In this embodiment, a crossing region of the upper electrode 5 (and organic EL layer 6) and lower electrode 7 serves as a light emitting region. Thus, a minute light emitting region having an area of 10 nm×10 nm can be obtained. The glass substrate 3 has the multi-stage structure as described above. Therefore, the light emitting region can be easily brought close to the object. The upper electrode 5, organic EL layer 6 and lower electrode 7 can be formed as thin films, respectively. Thus, with the organic EL device being adjacent to the object, the minute area of the object can be irradiated with light. Therefore, the organic EL device can be used as a light source in near field optics.

Preferably, the upper electrode opposite to the glass substrate 3 may be an upper electrode 5. The upper electrode 5 can be formed as a thinner film than the lower electrode in terms of their material. Namely, if the upper electrode is made from a light-transmissive material, e.g. gold (Au), light emission can be realized at a position closer to the object.

An explanation will be given of a process for manufacturing an organic EL device 1. First, a glass substrate 3 having a multi-stage structure 3 is prepared. In this embodiment, the glass substrate 3 is formed to have a height of the slope 11a, h1=3 μm and an area of the plane of 200 nm square. The height of the slope 11a is set at h1=3 μm in order to prevent the electrode having a thickness of 1 μm formed on the plane 12 from protruding from the plane 11.

Figure 11A:
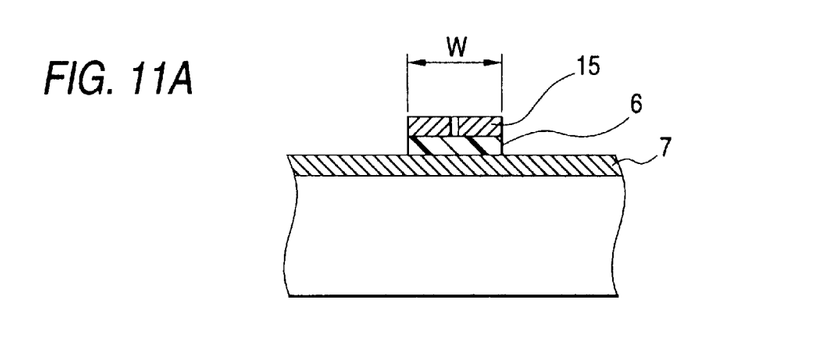

Using a shadow mask, which completely covers the plane 12 and slope 11a in FIG. 11 and has an opening of an electrode pattern to be formed on the plane 13 and slope 12a, aluminum is deposited on a necessary area. In this embodiment, aluminum is deposited to have a thickness of 100 μm.

Next, using another shadow mask, which covers the plane 13 and the minute electrode area of the plane 11 and have an opening of an electrode pattern to be formed on the plane 12, slope 11a and the vicinity of the plane 11, aluminum is deposited on a necessary area. In this embodiment, aluminum is deposited to have a thickness of 1 μm.

Figure 4A:
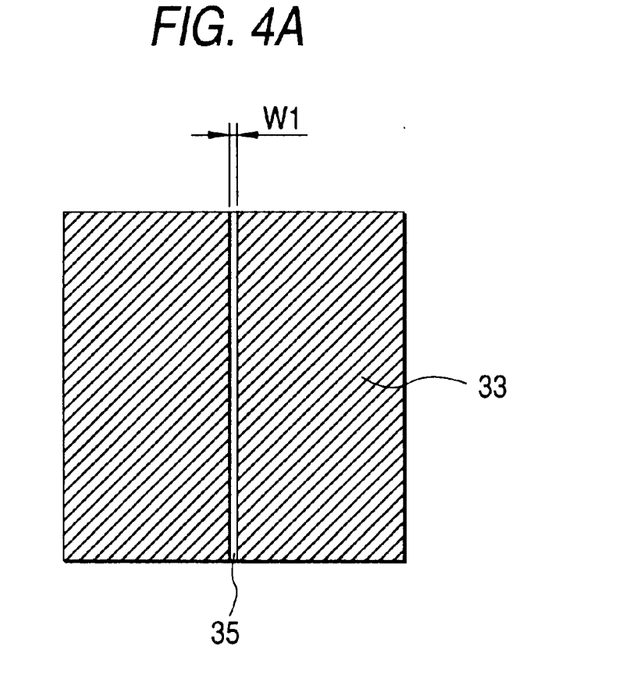
FIGS. 4A and 4B are views showing a shape of resist.

Further, resist is applied to the minute electrode area of the plane 11. The resist is exposed to electron beams so as to leave a necessary area as shown in FIG. 4A so that a resist layer 33 having an opening 35 is formed. Using the resist layer 33 as a mask, ITO is deposited on the electrode area. The resist layer 33 is removed (lift-off technique) so that a lower electrode 7 having a width w1=10 nm and a film thickness of 50 nm is formed at the opening 35. The lower electrode may be a metallic layer.

Figure 4B:
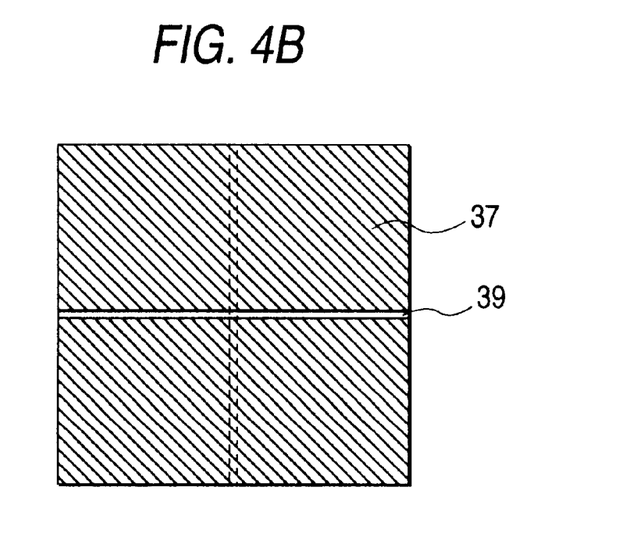

Likewise, resist is applied on the plane 11. As seen from FIG. 4B, the resist is exposed to electron beams so as to leave a necessary area as shown in FIG. 4B so that a resist layer 37 having an opening 39 is formed. From above, an organic EL layer 6 is stacked. In this embodiment, thin films of a triphenylamine derivative and an alumichinoline complex having a thickness of 50 nm is deposited by a vacuum evaporation technique using heating of a resistive wire under deposition conditions of a vacuum degree of $1\times10^{-5}-1\times10^{-7}$ Torr and a substrate temperature of room temperature.

The organic EL layer may be made of any other organic material emitting strong fluorescent light in a visible region, e.g. a derivative of anthracene, pyrene, tetracene, stilbene, berylene, chinone, phenaneslene, naphthane, naphthalimide, phthaloperinone, cyclopentadiene, or cyanine.

An ITO (indium-tin oxide) thin film having a thickness of 2 nm is deposited in order to form an upper electrode.

In the same manner as forming the lower electrode, the resist layer 37 is removed so that the light-emitting region as shown in FIGS. 3A and 3B can be formed.

Figure 5A:
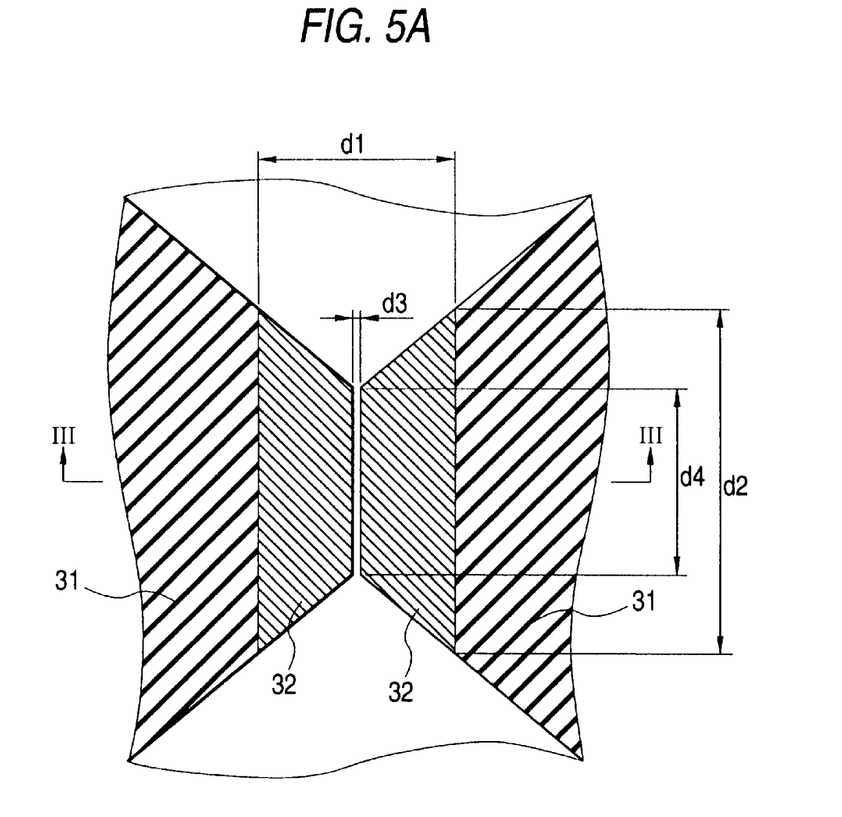
FIGS. 5A and 5B are a plan view and a sectional view of a shadow mask.
Figure 5B:
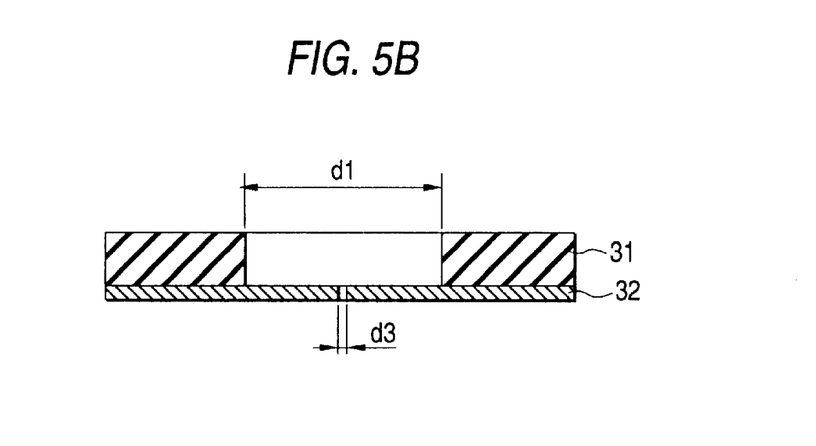

The electrodes having a minute width and organic EL layer may be deposited using a shadow mask 30 having a width d3=10 nm as shown in FIGS. 5A and 5B. In this case, first, the lower electrode is formed using such a shadow mask 30. Thereafter, the shadow mask 30 is rotated by 90°. In this state, the organic EL layer and upper electrode are formed.

Figure 6A:
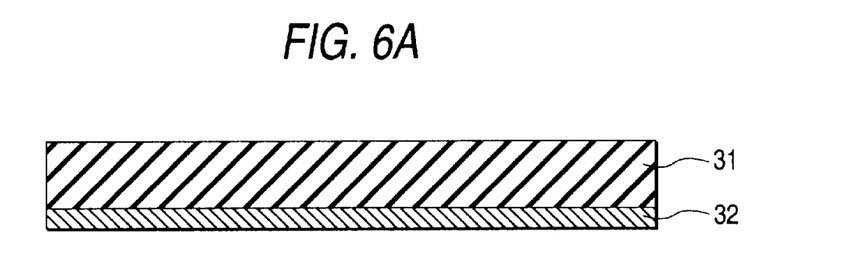
FIGS. 6A to 6C are views for showing a method for forming the shadow mask.
Figure 6B:
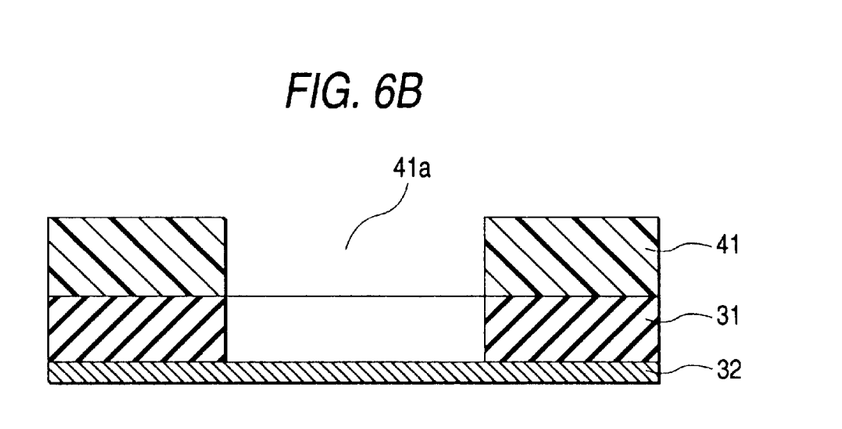
Figure 6C:
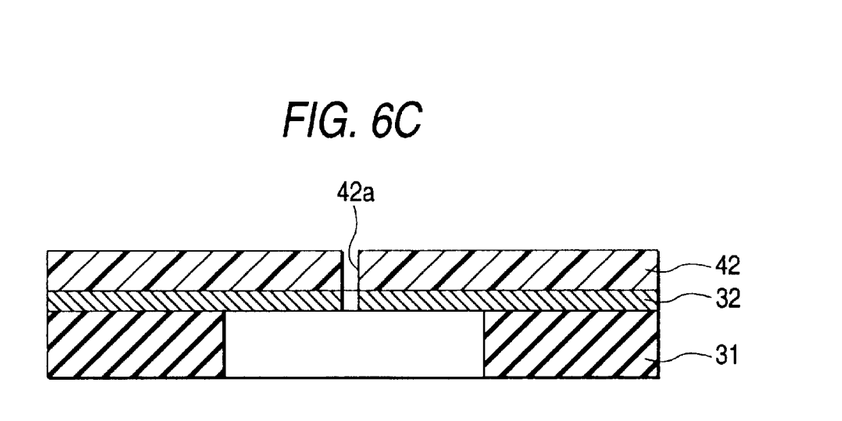

Referring to FIGS. 6A–6C, an explanation will be given of a method of making a shadow mask. As seen from FIG. 6A, a silicon oxide film 32 having a thickness of 50 nm is formed on the surface of a silicon substrate 31 having a thickness of 100 nm. As seen from FIG. 6B, a photoresist 41 with an opening 41a having a width d1=10 μm and a length. d2=15 μm is formed on the surface of the silicon substrate 31 opposite to the silicon oxide film 32. Using such a photoresist 41 as a mask, only the silicon substrate is etched. As seen from FIG. 6C, a photoresist 43 is applied to the entire surface of the silicon oxide film 32 and exposed to electron beams so that an opening 43a having a width d3=10 nm and length d4=10 nm is formed. Using such a photoresist 43 as a mask, the silicon oxide film 32 is etched. The photoresist 43 is removed to complete the shadow mask 30 as shown in FIGS. 5A and 5B.

It should be noted that deposition of the electrodes and EL layer is preferably made with the shadow mask being in intimate contact with the glass substrate 3.

Different shadow masks are usually used for deposition for the plane 11 and other regions. However, using a single shadow mask formed to have a shape covering the planes 11–13, the lower electrode, organic EL layer and upper electrode may be formed.

In this embodiment, although the organic EL layer was formed to have a width equal to that of the upper electrode, the EL layer may be provided on the entire surface of the lower electrodes.

Embodiment 2

An explanation will be given of the second embodiment of the organic EL device according to the present invention.

Figure 7A:
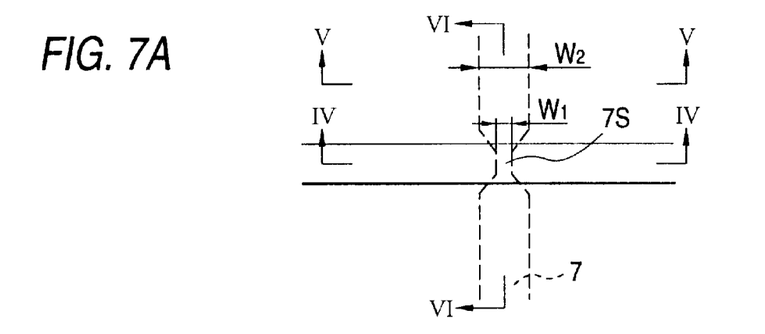
Figure 7B:
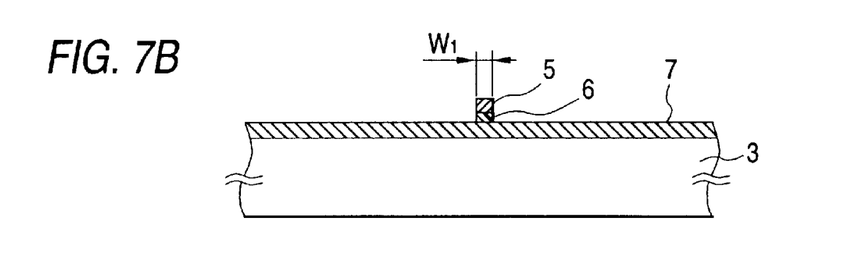
Figure 7C:
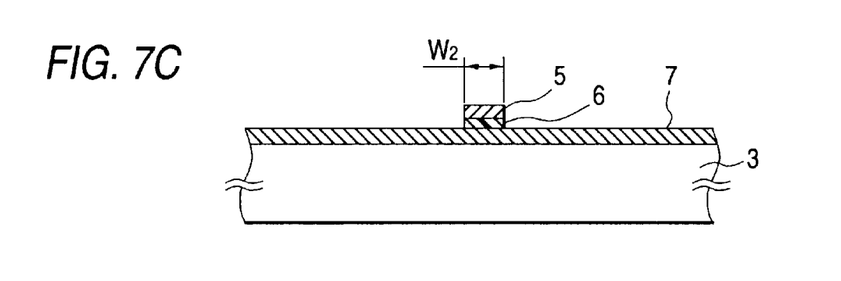
Figure 7D:
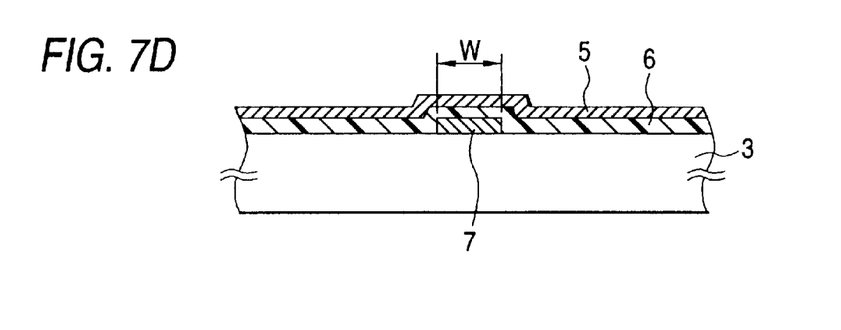

As seen from FIGS. 7A–7D, after a stripe pattern of the lower electrode 7 is formed, it was subjected to laser exposure through a metallic mask so that the edges of the pattern is evaporated to form a slender portion 7s. FIG. 7A is a plan view of the second embodiment of the organic EL device according to the present invention. FIGS. 7B to 7D are sectional views taken in lines IV—IV, V—V and VI—VI in FIG. 7A. As seen from these figures, this embodiment is characterized in that in a region where the lower electrode and upper electrode 5 are cross, the lower electrode has a portion with a smaller width than that of the remaining portion (w1<w2). The organic EL layer 6 is not patterned and formed on the entire surface of the lower electrode 7. As necessary, the organic EL layer 6 may be patterned simultaneously when the upper electrode is patterned.

The light-emitting area is defined by the organic EL layer 6 sandwiched between the lower electrode 7 and upper electrode 5. Therefore, in the configuration according to this embodiment, the light emitting area is defined by the portion with a smaller width so that the a minute light emitting area can be easily defined. Further, only the area which actually contributes to light emission is made minuscule, whereas the other area than the crossing region is left to have a unchanged width. For this reason, fine light-emission can be obtained without increasing the wiring resistance.

The configuration according to this embodiment can be used solely as a point light source. In addition, the minute light emission areas according to this embodiment can be arranged in a matrix form so as to increase the light emission area. This provides near field light in an array form with high reliability.

Embodiment 3

An explanation will be given of the third embodiment of the minuscule EL device according to the present invention.

Figure 8A:
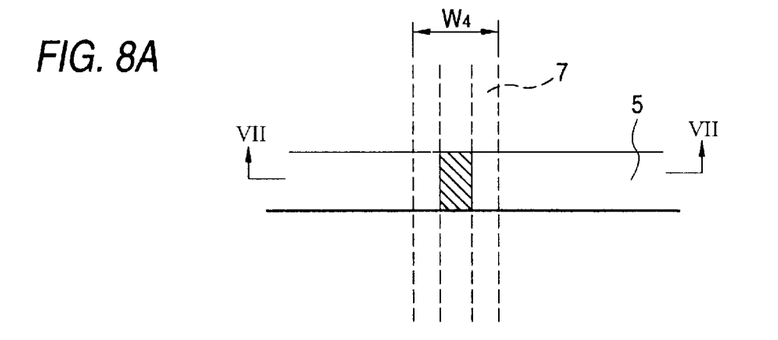
Figure 8B:
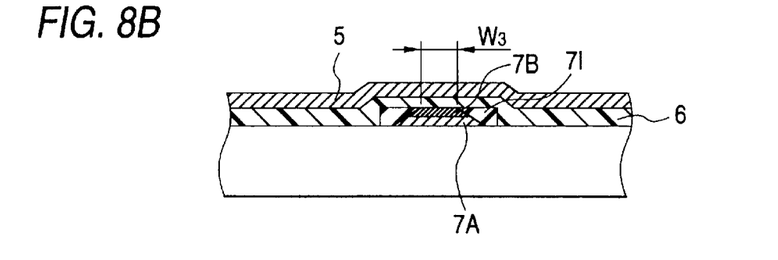

In this embodiment, as shown in FIGS. 8A and 8B, the lower electrode 7 is configured as a double layer consisting of a highly doped GaAs layer 7A and an aluminum layer 7B. In this embodiment, after a stripe pattern of the lower electrode 7 is formed, it was oxidized so that the edges of the aluminum layer 7B are changed into aluminum oxide 7i which is an insulating film. Thus, a contact area between the organic EL layer and lower electrode is substantially decreased. In this embodiment, the organic EL layer 6 and upper electrode 5 may be formed in the same manner as in the first embodiment described above. FIG. 8A is a plan view of this embodiment and FIG. 8B is a sectional view taken in line VII—VII.

In this configuration also, the fine light emitting area can be easily obtained. The oxidizing step for fining can be carried out without forming a mask pattern. This does not lead to an increase in the number of man-hours and also provides a fine light emitting area over the limit of lithography.

Incidentally, in this embodiment, although the lower electrode was configured as a double layer film, it may be configured as a single layer film which is oxidized with a resist pattern left after the stripe pattern is formed.

Embodiment 4

An explanation will be given of the fourth embodiment of the minuscule EL device according to the present invention.

Figure 9A:
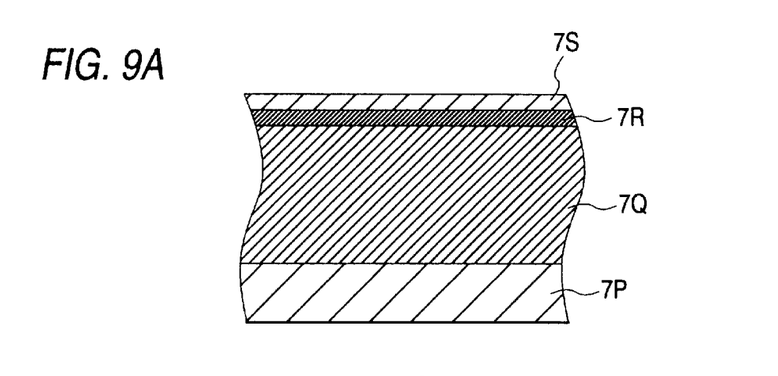
Figure 9B:
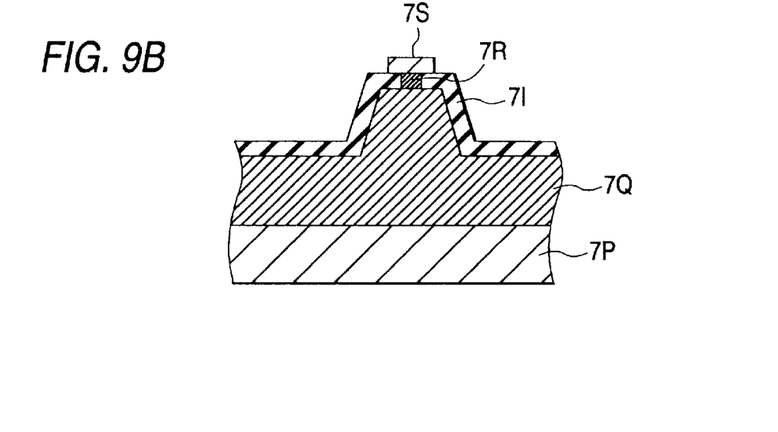

This embodiment is characterized by a method for making the lower electrode 7. As shown in FIG. 9A, the lower electrode is configured as a four-layer composite layer consisting of a GaAs layer 7P, a GaAlAs layer 7Q, an AlAs layer 7R and a GaAs layer 7S. The "mesa-etch" is performed to reach the midpoint of the GaAlAs layer 7Q to form a fine electrode pattern. Thereafter, the step of oxidizing is carried out. Thus, as shown in FIG. 9B, the GaAlAs layer 7Q except its portion below the GaAs layer becomes an insulating film through oxidation. The GaAs layer is partially oxidized by detouring of oxidation so that its area is reduced. Therefore, it constitutes a fine light emitting area together with the organic EL layer and upper electrode which are formed in the same manner as in the embodiments described above. Further, by controlling the ratio of film thickness and thermal treating temperature for oxidation among the GaAs layer 7P, GaAlAs layer 7Q, AlAs layer 7R and GaAs layer 7S, the ratio of the area to be oxidized can be adjusted. Incidentally, since the lower electrode is made of the material susceptible to a high temperature, the organic EL layer 6 such as which can be formed at a low temperature must be adopted.

Embodiment 5

An explanation will be given of the fifth embodiment of the minuscule EL device according to the present invention.

Figure 10A:
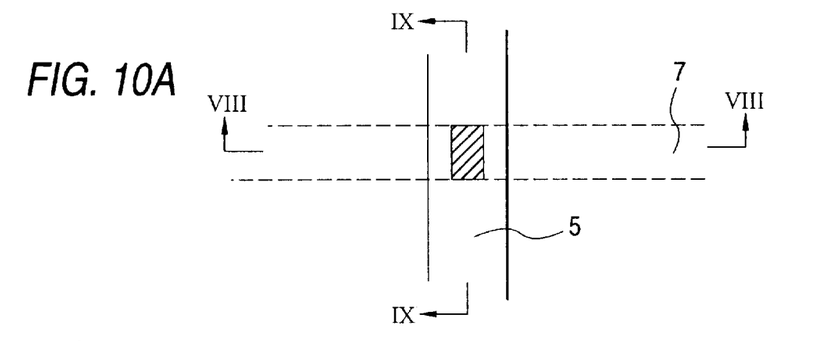
Figure 10B:
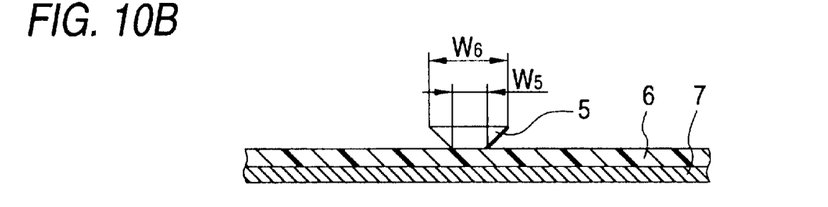

This embodiment is characterized in that the upper electrode has an inverted trapezoidal sectional shape as shown in FIGS. 10A and 10B. FIG. 10A is a plan view of this embodiment and FIG. 10B is a sectional view taken in line VIII—VIII in FIG. 10A. The inverted trapezoidal sectional shape can be formed through over-etching in the etching step for patterning the upper electrode. In this embodiment, the upper electrode has an inverted trapezoidal sectional shape so that the light emitting area which emits light under application of an electric field can be reduced, thereby forming a fine light emitting area.

Such a light emitting area can be formed in e.g. a slit shape having a very smaller width so as to provide a stable minuscule light-emitting device.

In the configuration according to this embodiment also, like the second embodiment, the light emitting area can be formed in an array shape.

Embodiment 6

An explanation will be given of the fifth embodiment of the minuscule EL device according to the present invention.

Figure 11B:
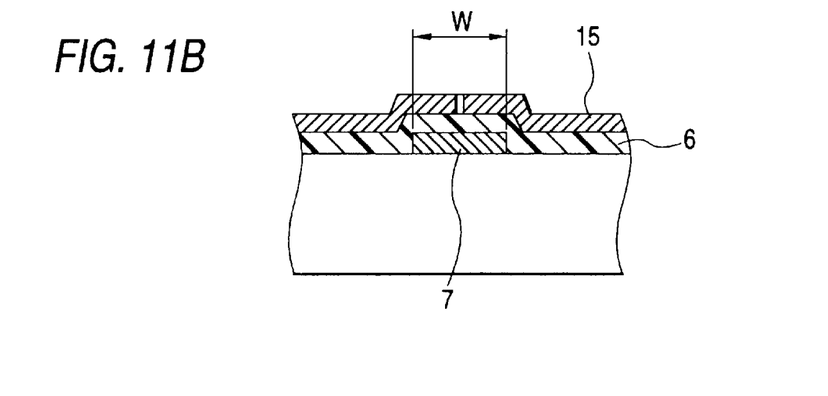

In this embodiment, as shown in FIGS. 11A and 11B and 11C, the upper electrode 15 is made of a Chromium (Cr) thin film which is a light shielding conductive film having a through-hole h in a region where the lower electrode and the upper electrode cross. The through-hole h, which has a diameter shorter than the wavelength of the light emitted from the organic EL layer, defines a fine light emitting area. FIG. 10A is a plan view of this embodiment, FIG. 11A is a sectional view taken in line VIII—VIII in FIG. 10A and FIG. 11B is a sectional view taken in line IX—IX.

In the configuration according to this embodiment, only the portion of the through-hole defines a light take-up area, i.e. the light emitting area of the organic EL device so that the fine light emitting area can be obtained. In this configuration, light with enhanced intensity can be taken out.

The following modification of this embodiment can be proposed. In an ordinary organic EL device composed of the lower electrode 7 formed on a substrate, organic EL layer 6 located thereon, and. upper electrode located thereon, an insulating light shielding mask is formed to cover the entire surface of the substrate. In a region of the light shielding mask where the lower electrode and upper electrode cross, a through-hole is formed which has a diameter shorter than the wavelength of the light emitted from the organic EL layer.

In the configuration according to this embodiment, only the portion of the through-hole defines a light take-out area, i.e. the light emitting area of the organic EL device so that the fine light emitting area can be obtained. In this configuration, light with enhanced intensity can be taken out.

Embodiment 7

An explanation will be given of the fifth embodiment of the minuscule EL device according to the present invention.

Figure 12:
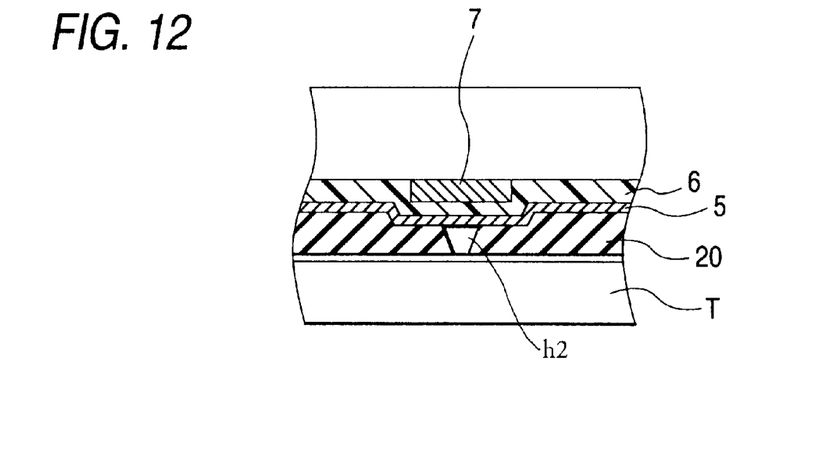

As seen from FIG. 12, this embodiment is characterized in that the though-hole h2 formed in the light shielding mask 20 has a diameter on the side of the upper electrode than on the side of the surface. In this embodiment, the other elements of the organic EL device can be formed in the same manner as in the other embodiments. In this embodiment, the organic EL device is illustrated in intimate contact with an object T irradiated with light. Since the light shielding mask is integrally-molded with the organic EL device, the degree of contact can be improved.

The light shielding mask 20 may be formed to be in intimate contact with the surface of the organic EL device, otherwise may be formed as a thin film on the surface of the device by vacuum evaporation or sputtering.

In this configuration, a beam can be formed which is converged with a smaller diameter than the opening diameter of the through-hole, thereby providing finer light emission.

The though-hole can be formed as a slit which has a width larger on the side of the upper electrode than on the side of the surface so that a more efficient fine light-emitting area can be formed. The thorough-hole can be as a finer slit through the beam exposure using the near field light.

Embodiment 8

An explanation will be given of the eighth embodiment of the minuscule EL device according to the present invention. As seen from FIGS. 13A and 13B which are a plan view and a sectional view, the organic EL device according to this embodiment includes a first and a second electrode 21 and 22 which are configured as Cr thin film patterns and an organic EL layer 23. The first and second electrodes have acute edges 21e and 22e, respectively which are opposite to each other through a fine gap G. The gap is filled with the organic EL layer 23.

Figure 13A:
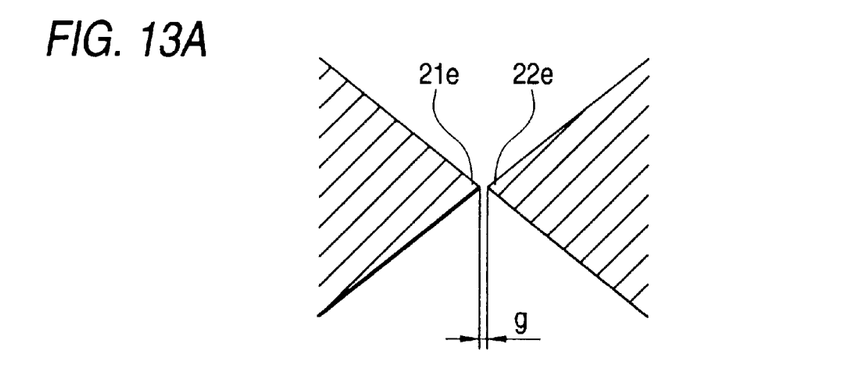
Figure 13B:
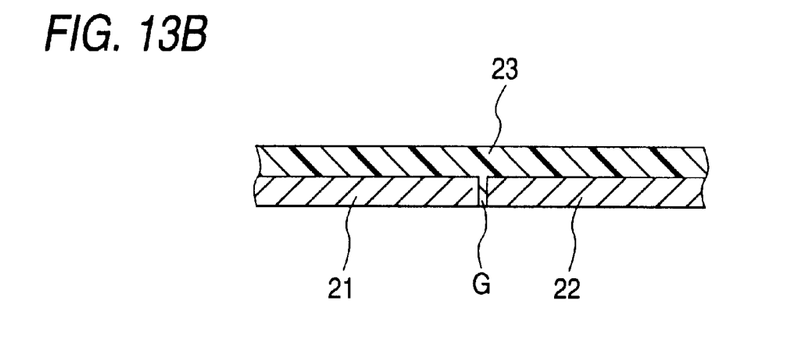

In such a configuration, the organic EL layer in the very fine gap G is caused to emit light so that the reliable fine light emitting beam can be obtained.

The shapes of the first and the second electrode can be modified as necessary.

Embodiment 9

An explanation will be given of the ninth embodiment of the minuscule EL device according to the present invention.

As seen from FIGS. 14A–14E, the first and the second electrode 71 are formed integrally, and are cut by laser to provide a fine gap G therebetween. The gap G is filled with an organic EL layer 72.

Figure 14A:
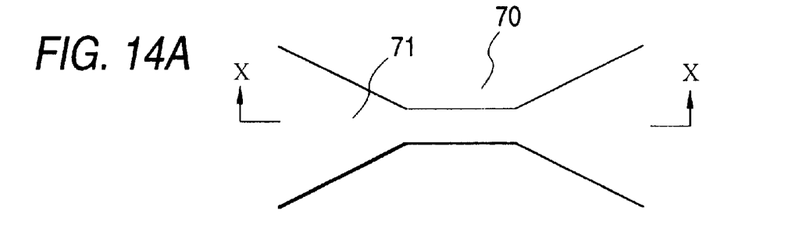
Figure 14B:
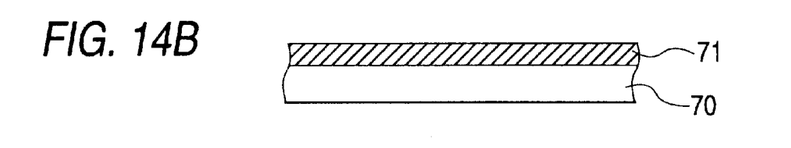
Figure 14C:
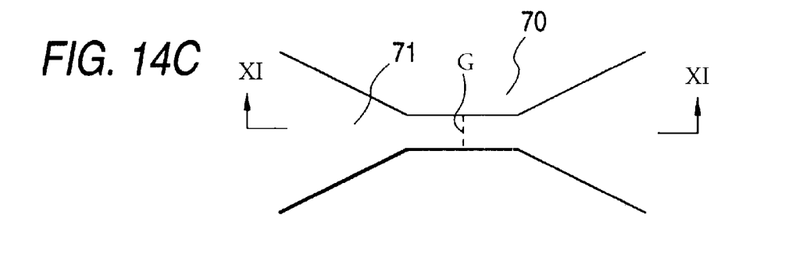
Figure 14D:
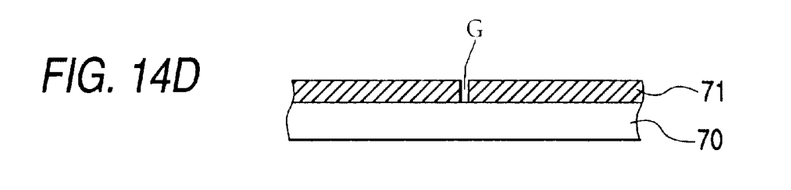
Figure 14E:
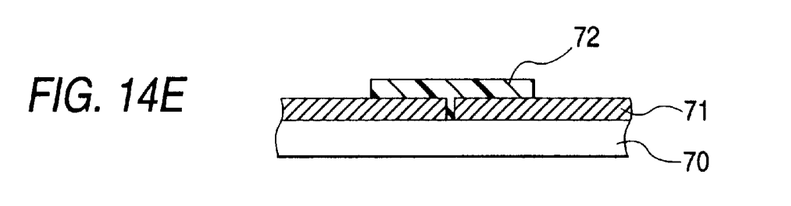

FIG. 14A is a plan view of this embodiment, FIG. 14B is a section view taken in line X—X of FIG. 14A, FIG. 14C is another plan view, FIG. 14D is a sectional view taken in line XI—XI of FIG. 14C, and FIG. 14E is another sectional view taken in line XI—XI of FIG. 14C.

In fabrication, as seen from FIGS. 14A and 14B, the Cr thin film pattern 71 is formed on a glass substrate 70 to have a small width in its central portion.

The Cr thin film pattern 71 is cut along line C by a laser beam so that it can be divided into the first and the second electrode 71A and 72B which are apart from each other through a gap G. The gap G has a length of about 10 nm.

The organic EL layer 72 is filled at least in the vicinity of the gap G.

As necessary, a protection film is provided, thus completing an organic EL device.

Further, a light shielding protection film may be further formed. A large number of electrodes can be formed on a monolithic substrate to provide a minuscule light-emitting area in an array form.

Embodiment 10

According to this embodiment, in the region where the upper electrode and the lower electrode cross, the electrode width is not reduced. Instead of this, the organic EL layer itself is changed into a non-light-emitting area thereby to reduce a light emitting area.

Specifically, the organic EL device includes a lower electrode formed on the substrate, a light emitting layer formed on the lower electrode and an upper electrode formed thereon and made of an oxygen permeable material. A partial region of the light emitting layer constitutes an oxide layer which is selectively formed by optical selective oxidation using light and oxygen which reaches through the upper electrode. The region of the light emitting layer where the oxide layer is located serves as a non-light emitting region so that the minimum width of the light emitting region in the organic EL layer is shorter than the wavelength of the light emitted from the organic EL layer.

In this configuration, after the organic EL device has been completed, the light emitting area can be reduced immediately before it is used. This makes it easy to deal with.

In the embodiments described in the specification, the organic EL layer was formed as a double-layer structure composed of triphenylamine derivative and alumichinoline complex. However, for simplicity of illustration, in the drawing, it is illustrated as a single layer. The organic EL layer may be configured as a multi-layer type such as a three, four and five layer type with a light-emitting auxiliary layer such as an electron transporting layer.

Further, in the embodiments described hitherto, the organic EL device has been described as a light for a near field. However, the organic EL device according to the present invention should not be applied to only a light source for the near field, may be applied to other devices which requires a minuscule light emitting area.

What is claimed is:

1. A minuscule light-emitting device having a light source used for near field optics, said light source being an organic EL device comprising:

a lower electrode;

an organic EL layer placed on or above the lower electrode; and an upper electrode placed on or above said organic EL layer, whereby light of a first wavelength is emitted from said organic EL layer through an opening of the upper electrode, wherein a diameter of the opening is less than the first wavelength.

2. A minuscule light-emitting device according to claim 1, wherein said lower electrode and said upper electrode are orthogonal to each other.

3. A minuscule light-emitting-device according to claim 1, wherein in a region where said lower electrode and said upper electrode cross, at least one of said lower electrode and said upper electrode has a portion having a smaller width than a remaining portion.

4. A minuscule light-emitting device according to claim 1, wherein in said organic EL device, said lower electrode and said upper electrode are formed in stripe patterns which are orthogonal to each other, and in a region where said lower electrode and said upper electrode cross, an interface between said organic EL layer and at least one of said lower electrode and said upper electrode is selectively oxidized except a portion thereof.

5. A minuscule light-emitting device according to claim 4, wherein said region has a minimum width which is shorter than a wavelength of light emitted from said organic EL layer.

6. A minuscule light-emitting device according to claim 1, wherein in said organic EL device, said lower electrode and upper electrode are formed in stripe patterns which are orthogonal to each other, and in a region where said lower electrode and said upper electrode cross, said upper electrode is formed in a stripe pattern having an inverted trapezoidal sectional shape.

7. A minuscule light-emitting device according to claim 1, wherein in said organic EL device, said lower electrode and said upper electrode are formed in stripe patterns which are orthogonal to each other, and in a region where said lower electrode and said upper electrode cross, said lower electrode is formed in a stripe pattern having an inverted trapezoidal sectional shape in which a region exclusive of an apex is covered with an insulating film.

8. A minuscule light emitting device according to claim 1, wherein said organic EL device includes a light emitting region having a long side and a short side, wherein the first wavelength is greater than the a length of the long side of the light emitting region.

9. A minuscule light emitting device according to claim 1, wherein said upper electrode is formed of a light shielding material that includes a through-hole positioned above a location where said upper electrode and said lower electrode cross, the through-hole having a diameter smaller than a wavelength of light emitted from said organic EL layer.

10. A minuscule light emitting device according to claim 1, wherein said upper electrode is formed of a light shielding material covering an entire surface of said substrate, wherein said upper electrode has a through-hole positioned above a location where said upper electrode and said lower electrode cross, the through-hole having a diameter smaller than a wavelength of light emitted from said organic EL layer.

11. A minuscule light-emitting device according to claim 10, wherein said through-hole has a diameter which is larger on the side of said upper electrode than on the side of the surface.

12. A minuscule light-emitting device according to claim 10, wherein said through-hole is a slit whose width is larger on the side of the upper electrode than the side of the surface.

13. A minuscule light-emitting device according to claim 10, wherein said through-hole is formed by beam exposure using near field optics.

14. A minuscule light-emitting device having a light source used for near field optics, said light source being an organic EL device comprising:

a first electrode and a second electrode having acute edges formed on a substrate so as to be opposite to each other through a fine gap;

an organic EL layer filling said gap, whereby light of a first wavelength is emitted from said organic EL layer through an opening of the upper electrode, wherein a diameter of the opening is less than the first wavelength.

15. A minuscule light emitting device according to claim 1, wherein said upper electrode is made of an oxygen permeable material, and wherein a partial region of the organic EL layer constitutes an oxide layer which is selectively formed by optical selective oxidation using light and oxygen which reaches through the upper electrode, and the region of the light emitting layer where the oxide layer is located serves as a non-light emitting region so that the minimum width of the light emitting region in the organic EL layer is shorter than the wavelength of the light emitted from the organic EL layer.

16. An organic EL device comprising:

a lower electrode;

an organic EL layer placed on or above said lower electrode; and an upper electrode placed on or above said organic EL layer, wherein said upper electrode has an opening for transmitting light of a first wavelength emitted from said organic EL layer such that a maximum dimension of the opening is less than the first wavelength.

17. An organic EL device according to claim 16, wherein said lower electrode and said upper electrode are orthogonal to each other.

18. An organic EL device according to claim 16, said lower electrode and said upper electrode are formed in stripe patterns which are orthogonal to each other, and in a region where said lower electrode and said upper electrode cross, an interface between said organic EL layer and at least one of said lower electrode and said upper electrode is selectively oxidized except a portion thereof.

19. An organic EL device according to claim 16, wherein said region has a minimum width which is shorter than a wavelength of light emitted from said organic EL layer.

20. A minuscule organic EL device comprising:

a lower electrode;

an organic EL layer placed on or above the lower electrode; and an upper electrode placed on or above said organic EL layer, wherein in a region where said lower electrode and said upper electrode cross, at least one of said lower electrode and said upper electrode has a first portion of a first width directly overlying a second portion of a second width which is less than the first width.

* * * * *